United States Patent [19]

Wilwerding

[11] 4,251,740
[45] Feb. 17, 1981

[54] CONTINUOUS FOCUS PROPORTIONAL CONTROLLER

[75] Inventor: Dennis J. Wilwerding, Littleton, Colo.

[73] Assignee: Honeywell Inc., Minneapolis, Minn.

[21] Appl. No.: 962,280

[22] Filed: Nov. 20, 1978

Related U.S. Application Data

[62] Division of Ser. No. 834,760, Sep. 19, 1977.

[51] Int. Cl.³ .................. H03K 17/94; H03K 5/00
[52] U.S. Cl. .......................... 307/247 A; 307/232; 328/109; 340/365 E
[58] Field of Search ................. 307/232, 247 A; 328/109; 340/365 E

[56] References Cited

PUBLICATIONS

I. B. Magrisso, Switch Release Detector Circuit, IBM Technical Disclosure Bulletin, vol. 17, No. 2, Jul. 1974, p. 500.

Primary Examiner—John Zazworsky
Attorney, Agent, or Firm—Charles J. Ungemach

[57] ABSTRACT

A circuit for use with switches that have contacts which may bounce upon closure or opening and produce a series of alternate closure and opening signals. The circuit operates eliminate the effect of all but the first of the closures or openings and thus avoid the problem of contact bounce.

2 Claims, 1 Drawing Figure

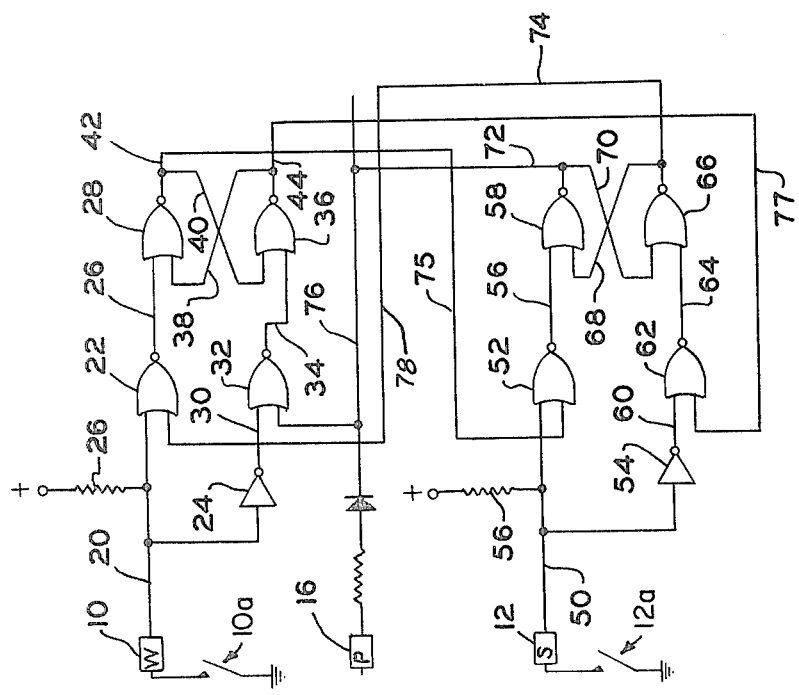

4,251,740

CONTINUOUS FOCUS PROPORTIONAL CONTROLLER

BACKGROUND OF THE INVENTION

This application is a division of copending application Ser. No. 834,760, filed Sept. 19, 1977.

The present invention relates generally to apparatus for preventing the effects of contact bounce in switches from having an undesirable effect. In particular, the present invention is directed to a system utilizing a pair of switches which alternately close and open for use in a circuit such as the auto focus system found in the above-mentioned copending application Ser. No. 834,760. In such an auto focus system, the exact time of closure of the switches is of considerable importance and switches that may bounce upon opening or closure produce a situation in which the remaining part of the system may not distinguish the initial closure or opening from subsequent closures or openings. The present invention provides a pair of cross-coupled flip-flops connected to the switches and operable to change state upon the first closure or opening of each of the switches with any subsequent bounce closures or openings having no effect.

SUMMARY OF THE INVENTION

The circuit of the present invention comprises a first flip-flop circuit having an output and having an input connected to a first switch whose contacts may bounce and a second flip-flop circuit having an output and having an input connected to a second switch whose contacts may bounce. The two flip-flop circuits are interconnected so that when the first switch, for example, opens, the first flip-flop changes state to produce an output signal indicative of the switch opening and at the same time sets the first flip-flop so that it will not respond to additional signals from the switch which may occur upon bounce. The cross-coupling is such that the output of the second flip-flop does not change. Subsequently, closure, for example, of the second switch operates the second flip-flop so that its output changes state to indicate the switch closure and at the same time sets the circuit so that it will not respond to subsequent openings and closings of that switch due to bounce. The output of the first flip-flop does not change upon closure of the second switch but the cross-coupled flip-flop is then set to receive subsequent alternate openings of the first and second switches. By such a system, only the first switch closure or opening of each switch has any effect on the output so that a circuit, such as an auto focus circuit of the above-mentioned copending application Ser. No. 834,760, may utilize the exact moment of closure and opening of each switch for timing purposes used in such auto focus systems.

BRIEF DESCRIPTION OF THE DRAWINGS

The FIGURE shows a schematic diagram of the cross-coupled flip-flop circuit of the present invention.

DETAILED DESCRIPTION OF THE PREFERRED EMBODIMENT

The FIGURE shows a schematic diagram of the preferred embodiment of the debounce circuitry of the present invention. A terminal 10 is shown as a box containing the letter "W" representing the input from the "window" or relative position switch 10a, a terminal 12 is shown as a box containing the letter "S" representing the input from the "sync" switch 12a.

Also shown in the FIGURE is a terminal 16 which is shown as a box containing the letter "P". This terminal is connected to the detector output of the peak detection circuitry described in my copending application Ser. No. 804,111, filed June 6, 1977. Terminal 16 is an output of the invention described in the above-mentioned copending application Ser. No. 834,760, the purpose of which is to remove the charge on the holding capacitor of the system whenever the sync switch operates at the completion of a scan and will not be further described herein.

As seen in the FIGURE, terminal 10 is connected by a conductor 20 to one input of a NOR gate 22, to the input of an inverter 24 and through a resistor 26 to the system's source of positive potential. The output of NOR gate 22 is connected by a conductor 26 to one input of a NOR gate 28. The output of inverter 24 is connected by a conductor 30 to one input of a NOR gate 32. The output of NOR gate 32 is connected by a conductor 34 to one input of a NOR gate 36. The output of NOR gate 36 is connected by a conductor 38 to the other input of NOR gate 28 and the output of NOR gate 28 is connected by a conductor 40 to the other input terminal of NOR gate 36. In this configuration, NOR gates 22, 28, 32 and 36, along with inverter 24 comprise a flip-flop, the non-inverted output of which is the output of NOR gate 28 on conductor 42 and the inverted output of which is the output of NOR gate 36 on conductor 44.

The sync switch terminal 12 is shown connected by a conductor 50 to one input terminal of a NOR gate 52, to the input of an inverter 54 and through a resistor 56 to the system source of positive potential. The output of NOR gate 52 is connected by a conductor 56 to one input of a NOR gate 58. The output of inverter 54 is connected by a conductor 60 to one input of a NOR gate 62, the output of which is connected by a conductor 64 to one input of a NOR gate 66. The output of NOR gate 66 is connected by a conductor 68 to the other input of NOR gate 58 and the output of NOR gate 58 is connected by a conductor 70 to the other input of NOR gate 66. NOR gates 52, 58, 62 and 66, with inverter 54 comprise a second flip-flop, the non-inverted output of which is the output of NOR gate 58 on conductor 72 and the inverted output of which is the output of NOR gate 66 on conductor 74.

The two flip-flops above-described are crossconnected so as to operate as a sort of third overall flip-flop. To this end, the non-inverted output of the first flip-flop circuit on conductor 42 is connected by a conductor 75 to the other input terminal of NOR gate 52 in the second flip-flop circuit. Likewise, the non-inverted output of the second flip-flop circuit appearing on conductor 72 is connected by a conductor 76 to the other input terminal of NOR gate 32 in the first flip-flop circuit. In similar fashion, the inverted output of the first flip-flop circuit on conductor 44 is connected by a conductor 77 to the second input terminal of the NOR gate 62 in the second flip-flop circuit, while the inverted output of the second flip-flop circuit on conductor 74 is connected by a conductor 78 to the other input terminal of NOR gate 22 in the first flip-flop circuit.

It is these two cross-section flip-flops which operate to provide electronic "debouncing" of the window and sync switches. In other words, when mechanical switches 10a and 12a close or open, they may tend to bounce on their contacts producing a series of separate signals which is undesirable particularly in a system such as that described in the above-mentioned copending application Ser. No. 834,760 which requires very close timing. The cross-coupled flip-flops will accept the first closure or opening of the bouncing switches and will ignore any further bouncing contacts that may result so long as the switches operate alternately and the bouncing of the contacts do not overlap. This allows for accurate mechanical positioning of the switch closing point. A more detailed description of the operation of the cross-coupled flip-flops will be set forth hereinafter.

OPERATION

In operation, assume that the window switches 10a is open so that a "1" signal exists on terminal 10 and this "1" signal is presented to the upper input terminal of NOR gate 22 and to the input terminal of inverter 24. The output of inverter 24 will thus be a "0" at this time. Assume further that the sync switch 12a opens at this time thus producing a "1" signal at terminal 12, which signal is presented to the upper input terminal of NOR gate 52 and to the input of inverter 54. A "0" signal therefore appears on line 60 at the output of inverter 54. The arrangement of signals in the cross-coupled flip-flops comprising inverters 24 and 54 and NOR gates 22, 28, 32, 36, 52, 58, 62 and 66, at this time, is as follows: the output of NOR gate 22 is a "0", the output of NOR gate 28 is a "1", the output of NOR gate 32 is a "0", the output of NOR gate 36 is a "0", the output of NOR gate 52 is a "0", the output of NOR gate 58 is a "1", the output of NOR gate 62 is a "1" and the output of NOR gate 66 is a "0". These signals cause the cross-coupled flip-flops to be in stable condition with a first output on line 44 representative of the condition of the window switch being open and a second output on line 74 representative of the condition of the sync switch being open. Although the cross-coupled flip-flops are presently stable, a zero signal upon terminal 10, as occurs upon closing switch 10a, will switch the output on line 44 to a "1". Similarly, a "0" signal on terminal 12, upon later closing of sync switch 12a, will change the signal on line 74 to a "1". Furthermore, it is the very first closure of the window and sync switches which produces the pulse causing the flip-flop to operate so that any bouncing of the switch contacts that may occur thereafter will have no effect on the outputs at conductors 44 and 74, respectively.

Assume now that the window switch closes causing a transition of the voltage at terminal 10 to go from a "1" to a "0". Even though the mechanical structure of the window switch may be such as to cause several bounces of the contacts and thus a series of "1" to "0" transitions and back, it is only the first impulse that has any effect on the cross-coupled flip-flop arrangement above-described. More specifically, as soon as terminal 10 receives a first "0" signal, it is presented to the upper input of NOR gate 22 whose lower input was already receiving a "0" signal. Thus, upon the first occurrence of a window switch "0" signal, the output of NOR gate 22 changes from a "0" to a "1". Since the lower input of NOR gate 28 is receiving a "0" signal at this time, the "0" output from NOR gate 22 causes NOR gate 28 to switch to a "0". This "0" signal is presented to the upper input of NOR gate 36 and to the lower input of NOR gate 52. However, since the upper input of NOR gate 52 is already receiving a "1" from sync switch terminal 12, its output will remain unchanged as a "0". However, since the output of NOR gate 32 on conductor 34 is a "0", the changed output of NOR gate 28 produces a pair of "0" signals as inputs to NOR gate 36 and thereby changes its output from a "0" to a "1". This changes the signal on conductor 44 to a "1" representative of window switch 10a being closed. The "1" signal on line 44 also changes the signal to the lower input terminal of NOR gate 62 which, since it is still receiving a "0" signal from inverter 54 as its upper input, changes the output on conductor 64 from a "1" to a "0". This signal is presented to the lower input of NOR gate 66 but since the upper input of this NOR gate was previously receiving a "1", there is no change in the output of NOR gate 66 and thus the signal on conductor 74 remains a "0" representative of sync switch 12a being open. Likewise, the unchanged "0" signal from NOR gate 66 is presented to the lower input of NOR gates 58, which, since it is still receiving a "0" signal from the output of NOR gate 52 as its upper input signal, continues to produce a "1" output on conductor 72 which via conductor 76 continues to produce a "1" signal on the lower input terminal of NOR gate 32. Thus, the output from NOR gate 32 will remain unchanged. The cross-coupled flip-flop arrangement is now stable, as can be seen by assuming that because of a bounce in window switch 10a the signal at terminal 10 changes back to a "1". The "1" signal at the upper terminal of NOR gate 22 coupled with the "0" signal on the lower terminal will cause the output of NOR gate 22 to change back to a "0". Now, however, the change to a "0" signal on the upper terminal of NOR gate 28 has no effect since the signal on its lower terminal is a "1". Also, the "1" signal now presented to inverter 24 has no effect even though a "0" signal is now presented to the upper terminal of NOR gate 32 since the lower terminal to NOR gate 32 is still a "1". Thus the bounces which may occur in switch 10a do not produce any effect, however the system is set so that upon the occurrence of a "0" signal from the closure of the sync switch 12a through terminal 12, it will operate to produce a "1" signal on conductor 74.

Assume now that the sync switch 12a closes producing a "0" signal at terminal 12 of the FIGURE. The first touching of the sync switch contacts produces a "0" signal at the upper input of NOR gate 52, which now is receiving two "0" input signals so that its output changes to a "1" on conductor 56. This presents a "1" signal to the upper input of NOR gate 58, which had previously been receiving two "0" input signals and, accordingly, the output of NOR gate 58 will change from a "1" to a "0" on conductor 72. This signal is fed by conductor 70 to the upper input of NOR gate 66, and by conductor 72 to the lower input of NOR gate 32 whose output does not change since the upper input terminal is receiving a "1" from inverter 24.

The "0" signal now appearing at terminal 12 is also presented to inverter 54 so that its output changes to a "1" on conductor 60. The output of NOR gate 62 does not change, however, since its lower input had previously been a "1" and, accordingly, the output on conductor 64 remains a "0". NOR gate 66 is, however, now receiving two "0" input signals so its output changes to a "1" on conductor 74 and this signal is fed to the lower input of NOR gate 58 and to the lower input of NOR gate 22. The output of NOR gate 22, which was previously receiving two "0" input signals, will now change from a "1" to a "0", but this signal will have no effect on NOR gate 28, since it has been receiving a "1" signal at its lower input terminal. Thus, the signal on conductor 42 will remain a "0" and since both inputs to NOR gate 36 are still "0", the output on conductor 44 will remain a "1". The cross-coupled flip-flop arrangement is now stable as can be seen by assuming that sync switch 12a bounces to produce another "1" at terminal 12. While this "1" will change the output of NOR gate 52 back to a "0", the lower input to NOR gate 58 is now a "1" from NOR gate 66 and so the output of NOR gate 58 will remain a "0". Furthermore, the new "1" to inverter 54 will produce a "0" at the upper input terminal of NOR gate 62 but since the lower input is still a "1", the output of NOR gate 62 will not change. The system is now set, however, so that upon the occurrence of a "1" signal from closure of window switch 10a through terminal 10, it will operate to produce a "0" on conductor 44.

The next occurrence in the cycle is the reopening of the window switch 10a which produces a "1" signal on terminal 10. This has the effect of again resetting the cross-coupled flip-flops.

Specifically, the "1" signal on conductor 20 is presented to the upper input of NOR gate 22 but since NOR gate 22 was previously receiving a "1" input at its lower input, there is no change in its output on conductor 26. The "1" signal on conductor 20 passed through inverter 24 produce a "0" signal on the upper input of NOR gate 32 and since this NOR gate now has two "0" signals as inputs, its output changes from a "0" to a "1" and this signal is fed to the lower input of NOR gate 36. NOR gate 36 had previously been receiving two "0" signals as its inputs so its output now changes from a "1" to a "0" on conductor 44 which signal is presented to the lower input of NOR gate 62. The output of NOR gate 62 does not change since it had previously been receiving a "1" on its upper input but the "0" signal on the output of NOR gate 36 does, however, change the input signal to the lower input of NOR gate 28 and since this NOR gate now receives two "0" signals as inputs, its output will change to a "1" on conductor 42. The "1" signal on conductor 42 is presented to the lower input of NOR gate 52 which had previously been receiving two "0" input signals so that its output now changes to a "0" on conductor 56. This does not effect the output of NOR gate 58 since the lower input of this NOR gate had previously been receiving a "1" signal.

The final step is that the sync switch 12a reopens and the signal appearing on terminal 12 again becomes a "1" and the circuit is in the same situation it was at the beginning previously described.

It is thus seen that I have provided a circuit which nullifies the effects of bouncing contacts in switches. Many obvious changes and alterations to the circuit described in connection with the preferred embodiment will occur to those skilled in the art and I do not wish to be limited to the apparatus specifically described. I intend only to be limited by the following claims.

The embodiments of the invention in which an exclusive property or right is claimed are defined as follows:

1. Apparatus for use with a pair of switches that alternate in their operation, each switch having an open state and a closed state and having contacts that may bounce to produce a plurality of signal pulses, comprising:

a first flip-flop having a first input connected to the first of the switches and having a second input and an output;

a second flip-flop having a first input connected to the second of the switches and having a second input and an output;

means connecting the output of the first flip-flop to the second input of said second flip-flop; and means connecting the output of the second flip-flop to the second input of the first flip-flop whereby the output of the first flip-flop changes upon the occurrence of the first contact state change closure of the first of the switches and the output of the second flip-flop changes upon the occurrence of the first state change closure of the second of the switches.

2. Apparatus for use with a pair of switches that alternate in their operation, each switch having contacts that may bounce to produce a plurality of signal pulses, comprising:

first, second, third, fourth, fifth, sixth, seventh, and eighth gates, each having first and second inputs and an output;

first and second inverters, each having an input and an output;

means connecting a first of these switches to the first input of the first gate and to the input of the first inverter;

means connecting the output of the first inverter to the first input of the second gate;

means connecting the output of the first gate to the first input of the third gate;

means connecting the output of the second gate to the first input of the fourth gate;

means connecting the second of the switches to the first input of the fifth gate and to the input of the second inverter;

means connecting the output of the second inverter to the first input of the sixth gate;

means connecting the output of the fifth gate to the first input of the seventh gate;

means connecting the output of the sixth gate to the first input of the eighth gate;

means connecting the output of the third gate to the second input of the fourth gate and to the second input of the fifth gate;

means connecting the output of the fourth gate to the second input of the third gate and to the second input to the sixth gate;

means connecting the output of the seventh gate to the second input of the eighth gate and to the second input of the second gate; and means connecting the output of the eighth gate to the second input of the seventh gate and to the second input of the first gate whereby the output of the third gate changes upon the occurrence of the first contact closure of the first of the switches and the output of the seventh gate changes upon the occurrence of the first contact closure of the second of the switches.

* * * * *